US008436754B2

(12) United States Patent
Hu et al.

(10) Patent No.: US 8,436,754 B2
(45) Date of Patent: May 7, 2013

(54) ENCODING AND DECODING METHOD AND DEVICE

(75) Inventors: Chen Hu, Shenzhen (CN); Lei Miao, Shenzhen (CN); Zexin Liu, Bejing (CN); Longyin Chen, Shenzhen (CN); Qing Zhang, Shenzhen (CN); Herve Marcel Taddei, Voorburg (NL)

(73) Assignee: Huawei Technologies Co., Ltd., Shenzhen (CN)

( * ) Notice: Subject to any disclaimer, the term of this patent is extended or adjusted under 35 U.S.C. 154(b) by 118 days.

(21) Appl. No.: 13/086,780

(22) Filed: Apr. 14, 2011

(65) Prior Publication Data

US 2011/0187564 A1 Aug. 4, 2011

(30) Foreign Application Priority Data

Mar. 27, 2009 (WO) ................ PCT/CN2009/071051

(51) Int. Cl.
*H03M 7/38* (2006.01)

(52) U.S. Cl.
USPC ............. 341/51; 375/242; 375/295; 375/316; 375/286; 709/205; 709/246; 382/232; 715/234; 715/700; 715/729; 715/854; 704/221

(58) Field of Classification Search .................. 375/242, 375/295, 316.286; 704/500–503, 221; 715/234, 715/700, 729, 854; 382/232; 709/246, 205; 341/50–70; 340/407.1, 407.2
See application file for complete search history.

(56) References Cited

U.S. PATENT DOCUMENTS 5,751,232 A * 5/1998 Inoue et al. .................... 341/63
5,758,316 A * 5/1998 Oikawa et al. ............. 704/200.1

(Continued)

FOREIGN PATENT DOCUMENTS

CN 1623185 A 6/2005
CN 1795495 A 6/2006

(Continued)

OTHER PUBLICATIONS

Foreign Communication From a Counterpart Application, Chinese Application No. 200980146905.7, Second Chinese Office Action dated Jul. 12, 2012, 4 pages.

(Continued)

*Primary Examiner* — Lam T Mai
(74) *Attorney, Agent, or Firm* — Conley Rose, P.C.; Grant Rodolph; Nicholas K. Beaulieu

(57) ABSTRACT

The present invention relates to information processing technologies and discloses an encoding and decoding method and device to solve the poor decoding quality problem. The technical solution of the present invention includes: encoding each sample of an input signal to generate an encoded signal of a core layer; comparing residuals of all or a part of the samples of the input signal with encoding thresholds, where the residuals are generated by core layer encoding, and performing encoding according to comparison results to generate an encoded signal of an enhancement layer; and writing the encoded signal of the core layer and the encoded signal of the enhancement layer into a bitstream to generate an encoded signal of the input signal.

6 Claims, 9 Drawing Sheets

U.S. PATENT DOCUMENTS

| | | | | |
|---|---|---|---|---|
| 6,912,316 | B2 * | 6/2005 | Botchkarev | 382/232 |
| 7,142,612 | B2 * | 11/2006 | Horowitz et al. | 375/286 |
| 7,328,160 | B2 * | 2/2008 | Nishio et al. | 704/500 |
| 7,406,410 | B2 * | 7/2008 | Kikuiri et al. | 704/221 |
| 7,486,207 | B2 * | 2/2009 | D'Antonio et al. | 341/51 |
| 7,535,390 | B2 * | 5/2009 | Hsu | 341/118 |
| 8,134,484 | B2 * | 3/2012 | Hu et al. | 341/51 |
| 8,135,577 | B2 * | 3/2012 | Seymour et al. | 704/9 |
| 8,140,343 | B2 * | 3/2012 | Hu et al. | 704/500 |
| 2001/0046324 | A1 * | 11/2001 | Bouchard et al. | 382/232 |
| 2003/0171919 | A1 | 9/2003 | Kim et al. | |
| 2003/0220783 | A1 | 11/2003 | Streich et al. | |
| 2005/0017879 | A1 * | 1/2005 | Linzmeier et al. | 341/50 |
| 2007/0043575 | A1 | 2/2007 | Onuma et al. | |
| 2007/0274383 | A1 | 11/2007 | Yu et al. | |
| 2008/0018506 | A1 | 1/2008 | Raveendran | |
| 2008/0033717 | A1 | 2/2008 | Sato et al. | |
| 2009/0259477 | A1 | 10/2009 | Ashley et al. | |
| 2011/0181449 | A1 | 7/2011 | Hu et al. | |

FOREIGN PATENT DOCUMENTS

| | | | |
|---|---|---|---|
| CN | 1890711 | A | 1/2007 |
| CN | 1905010 | A | 1/2007 |
| EP | 1619664 | A1 | 1/2006 |
| GB | 2073554 | A | 10/1981 |
| WO | 2005036528 | A1 | 4/2005 |
| WO | 2008074251 | A1 | 6/2008 |
| WO | 2010108332 | A1 | 9/2010 |

OTHER PUBLICATIONS

Foreign Communication From a Counterpart Application, Chinese Application No. 200980146905.7, Partial English Translation of Second Chinese Office Action dated Jul. 12, 2012, 5 pages.

ITU-T, "Series G: Transmission Systems and Networks, Digital Terminal Equipments-Coding of Analogue Signals by Pulse Code Modulation, Wideband Embedded Extensions for G. 711 Pulse Code Modulation," ITU-T Recommendation G.711.1, 82 pages, Mar. 2008.

Dai, et al., "High Fidelity Multichannel Audio Coding," EURASIP Book Series on Signal Processing and Communications, vol. 2, 2006, 243 pages.

Davis, Y., "Digital Audio Compression," Digital Technical Journal, vol. 5, No. 2, Spring 1993, 14 pages.

Garrod, Susan A.R., "D/A and A/D Converters," Ed. Richard C. Dorf, The Electrical Engineering Handbook, Boca Raton: CRC Press LLc, 2000, 10 pages.

Foreign Communication From a Related Counterpart Application, PCT Application PCT/CN2009/071051, International Search Report dated Jan. 7, 2010, 4 pages.

Foreign Communication From a Related Counterpart Application, PCT Application, PCT/CN2009/ 071051, Written Opinion dated Jan. 7, 2010, 4 pages.

ITU-T, "General Aspects of Digital Transmission Systems, Terminal Equipments, 7kHz Audio-Coding Within 64 KBIT/S," ITU-T Recommendation G.722, 75 pages, 1988.

ITU-T, G.722—SWB: Proposed Draft Specification for the Superwideband Embedded Extension for ITU-T G.722, Study Group 16—Contribution 463, Study Period 2009-2011, COM 16—C 463—E, Jul. 2010, 90 pages.

Miao, Lei, et al., "G.711.1 Annex D and G.722 Annex B—New ITU-T Superwideband Codecs," Acoustics, Speech and Signal Processing (ICASSP), 2011 IEEE International Conference, May 22-27, 2011, pp. 5232-5235.

Notice of Allowance dated Oct. 31, 2011, 8 pages, U.S. Appl. No. 13/086,774, filed Apr. 14, 2011.

Notice of Allowance dated Nov. 29, 2011, 5 pages, U.S. Appl. No. 13/086,774, filed Apr. 14, 2011.

Foreign Communication From a Related Counterpart Application, PCT Application, PCT/CN2009/071051, English Translation of International Search Report dated Jan. 7, 2010, 4 pages.

Foreign Communication From a Related Counterpart Application, PCT Application, PCT/CN2009/071051, English Translation of Written Opinion dated Jan. 7, 2010, 4 pages.

Foreign Communication From a Related Counterpart Application, European Application No. 09842069.8, Extended European Search Report dated Apr. 16, 2012, 9 pages.

* cited by examiner

ENCODING AND DECODING METHOD AND DEVICE

CROSS-REFERENCE TO RELATED APPLICATION

This application is a continuation of International Application No. PCT/CN2009/071051 filed on Mar. 27, 2009, which is hereby incorporated by reference in its entirety.

FIELD OF THE INVENTION

The present invention relates to signal processing technologies, and in particular, to an encoding and decoding method and device.

BACKGROUND OF THE INVENTION

In prior arts, coded bits are generally added to improve the quality of speech/audio signals encoded by traditional encoding methods, such as the pulse code modulation (PCM) method and the adaptive differential pulse code modulation (ADPCM) method.

In the process of implementing the present invention, the inventor finds at least the following problems in the prior arts:

After coded bits are added, if a decoder supports only the decoding of encoded signals of a low bit rate, or if the decoder receives only the encoded signals of the low bit rate due to insufficient network bandwidth and poor transmission quality, the decoder can only decode the encoded signals of the low bit rate, resulting in poor quality of decoded signals. For example, if the encoder and decoder use the traditional ADPCM encoding and decoding method, the encoded signals of a low bit rate decoded by the decoder are even worse than the decoded encoded signals that are generated without adding extra bits.

SUMMARY OF THE INVENTION

Embodiments of the present invention provide an encoding and decoding method and device to improve decoding quality.

To fulfill the objective, the following technical solution is provided:

An encoding method that includes: encoding each sample of an input signal to generate an encoded signal of a core layer; comparing residuals of all or a part of the samples of the input signal with encoding thresholds, where the residuals are generated by core layer encoding, and performing encoding according to comparison results to generate an encoded signal of an enhancement layer; and writing the encoded signal of the core layer and the encoded signal of the enhancement layer into a bitstream to generate an encoded signal of the input signal.

An encoding device that includes: a first encoding unit, configured to encode each sample of an input signal to generate an encoded signal of a core layer; a second encoding unit, configured to compare residuals of all or a part of the samples of the input signal with encoding thresholds, where the residuals are generated by core layer encoding, and perform encoding according to comparison results to generate an encoded signal of an enhancement layer; and a generating unit, configured to write the encoded signal of the core layer generated by the first encoding unit and the encoded signal of the enhancement layer generated by the second encoding unit into a bitstream to generate an encoded signal of the input signal.

A decoding method that includes: obtaining an encoded signal of a core layer from an encoded signal, and decoding the encoded signal of the core layer to obtain each index corresponding to each sample of a quantized table of the core layer; and if the encoded signal further includes an encoded signal of an enhancement layer, using the encoded signal of the enhancement layer to modify the index corresponding to each sample, of the quantized table of the core layer, and obtaining a quantized value to generate a decoded signal according to the modified index; if the encoded signal does not include the encoded signal of the enhancement layer, obtaining the quantized value to generate the decoded signal according to the index of the quantized table of the core layer.

A decoding device that includes: a decoding unit, configured to obtain an encoded signal of a core layer from an encoded signal, and decode the encoded signal of the core layer to obtain each index corresponding to each sample of a quantized table of the core layer; and a generating unit, configured to: if the encoded signal further includes an encoded signal of an enhancement layer, use the encoded signal of the enhancement layer to modify the index corresponding to each sample, of the quantized table of the core layer, and obtain a quantized value to generate a decoded signal according to the modified index; if the encoded signal does not include the encoded signal of the enhancement layer, obtain the quantized value to generate the decoded signal according to the index corresponding to each sample, of the quantized table of the core layer.

With the encoding and decoding methods and devices provided by embodiments of the present invention, the encoder may encode each sample of the input signal to generate an encoded signal of the core layer, compare residuals of all or a part of the samples of the input signal with encoding thresholds, where the residuals are generated by core layer encoding, and perform encoding according to comparison results to generate an encoded signal of the enhancement layer, thus improving encoding quality; because the encoded signal of the enhancement layer is generated by comparing residuals of all or a part of the samples of the input signal with encoding thresholds, where the residuals are generated by core layer encoding, if the decoder supports only the decoding of encoded signals of a low bit rate, or if the decoder receives only the encoded signals of the low bit rate due to insufficient network bandwidth and poor transmission quality, the quality of the decoded signals generated by the decoder according to the encoded signals of the core layer may be the same as the quality of the encoded signals that are generated by low bit rate encoding, and therefore the decoding quality is improved.

BRIEF DESCRIPTION OF THE DRAWINGS

To make the technical solution of the present invention clearer, the accompanying drawings for illustrating the embodiments of the present invention are outlined below. Apparently, the accompanying drawings are exemplary only, and those skilled in the art can derive other drawings from such accompanying drawings without creative efforts.

DETAILED DESCRIPTION OF THE EMBODIMENTS

The technical solution of the embodiments of the present invention is hereinafter described in detail with reference to the accompanying drawings. Apparently, the embodiments are only exemplary embodiments of the present invention and the present invention is not limited to such embodiments. All other embodiments, which can be derived by those skilled in the art from the embodiments given herein without any creative efforts, fall within the scope of the present invention.

Embodiments of the present invention provide an encoding and decoding method and device to solve the following problem in the prior arts: When coded bits are added to improve the encoding quality, if the decoder supports only the decoding of encoded signals of a low bit rate, or if the decoder receives only the encoded signals of the low bit rate due to insufficient network bandwidth and poor transmission quality, the quality of the decoded signals generated by the decoder is poor.

Figure 1:
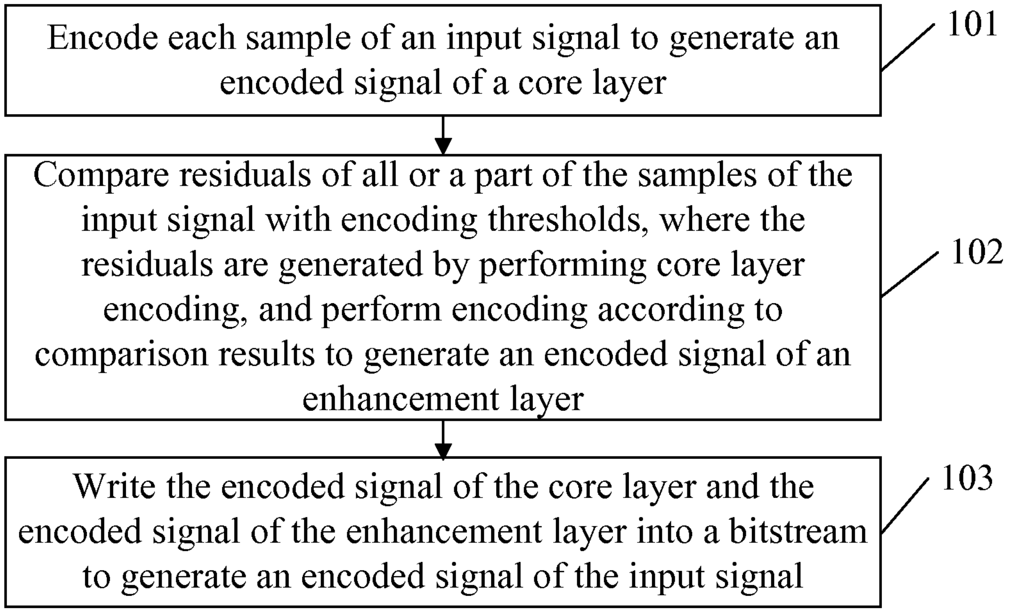
FIG. 1 is a flowchart of an encoding method provided by an embodiment of the present invention.

As shown in FIG. 1, the encoding method provided by an embodiment of the present invention includes:

Step 101: Encode each sample of an input signal to generate an encoded signal of a core layer.

Step 102: Compare residuals of all or a part of the samples of the input signal with encoding thresholds, where the residuals are generated by core layer encoding, and perform encoding according to comparison results to generate an encoded signal of an enhancement layer.

Step 103: Write the encoded signal of the core layer and the encoded signal of the enhancement layer into a bitstream to generate an encoded signal of the input signal.

With the encoding method provided by the embodiment of the present invention, the encoder encodes each sample of the input signal to generate an encoded signal of the core layer, compares residuals of all or a part of the samples of the input signal with encoding thresholds, where the residuals are generated by core layer encoding, and performs encoding according to comparison results to generate an encoded signal of the enhancement layer, thus improving encoding quality; because the encoded signal of the enhancement layer is generated by comparing residuals of all or a part of the samples of the input signal with encoding thresholds, where the residuals are generated by core layer encoding, if the decoder supports only the decoding of encoded signals of a low bit rate, or if the decoder receives only the encoded signals of the low bit rate due to insufficient network bandwidth and poor transmission quality, the quality of the decoded signals generated by the decoder according to the encoded signals of the core layer may be the same as the quality of the encoded signals that are generated by low bit rate encoding, and therefore the decoding quality is improved.

The encoding method provided by the embodiment of the present invention may encode narrowband, wideband, ultra-wideband or full-band speech/audio signals. To make the technical solution of the embodiments of the present invention clearer to those skilled in the art, the following describes the technical solution by using the encoding method provided by an embodiment of the present invention to encode an ultra-wideband audio signal with the valid bandwidth being 14 KHz.

Figure 2:
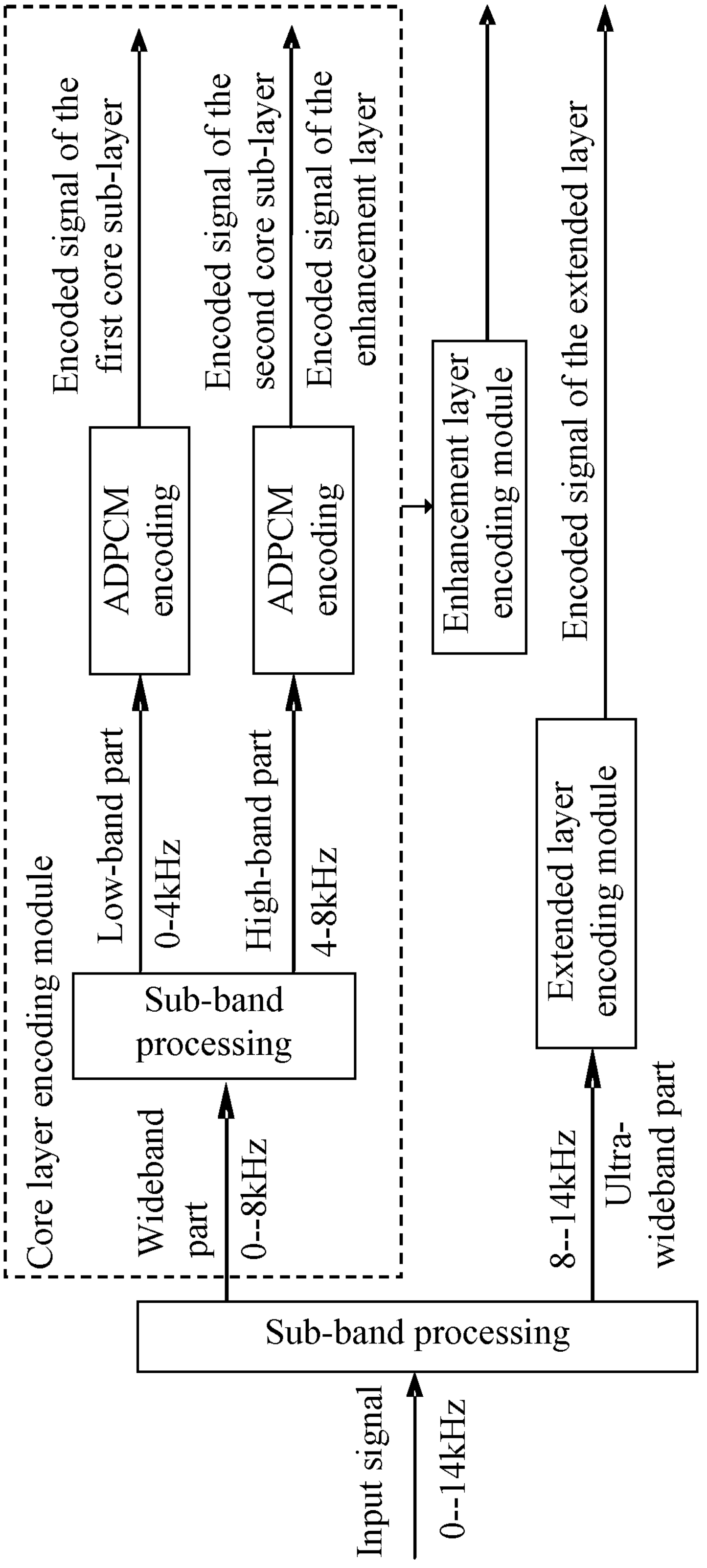
FIG. 2 shows a structure for implementing an encoding method provided by another embodiment of the present invention.

An encoding method provided by another embodiment of the present invention may encode the ultra-wideband audio signal through three encoding modules. As shown in FIG. 2, the three encoding modules are: core layer encoding module, enhancement layer encoding module, and extended layer encoding module.

Figure 3:
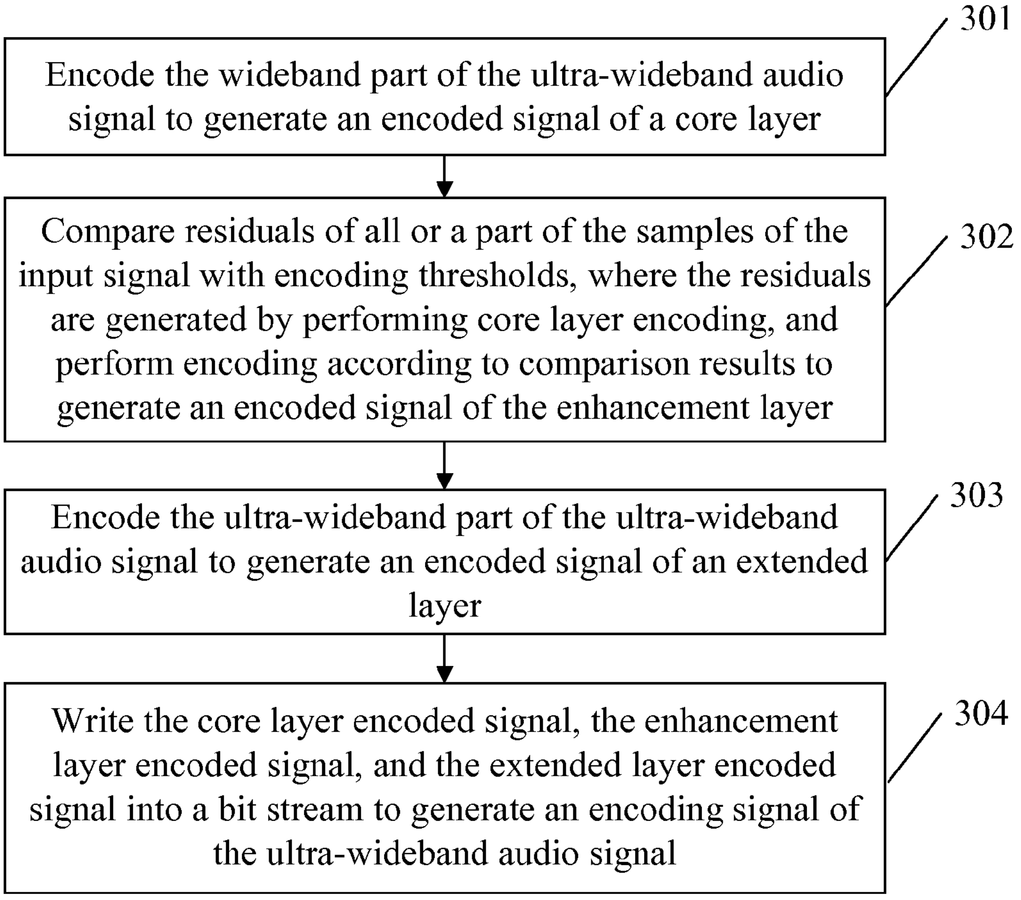
FIG. 3 is a flowchart of an encoding method provided by another embodiment of the present invention.

As shown in FIG. 3, the steps of encoding the ultra-wideband audio signal by using the three encoding modules shown in FIG. 2 by using the encoding method provided by another embodiment of the present invention may include:

Step 301: Use the core layer encoding module shown in FIG. 2 to encode the wideband part of the ultra-wideband audio signal to generate an encoded signal of a core layer.

In this embodiment, the wideband part of the ultra-wideband audio signal is the 0-8 KHz part of the ultra-wideband audio signal, and the encoder may divide the ultra-wideband audio signal to obtain the 0-8 KHz part of the ultra-wideband audio signal.

Figure 4:
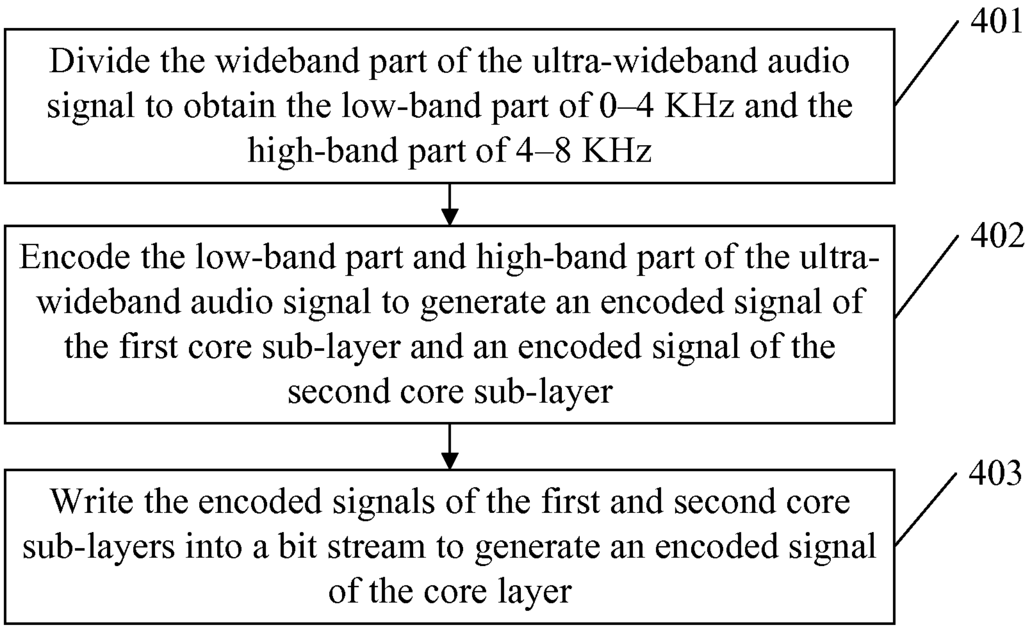
FIG. 4 is a flowchart of step 301 in an encoding method provided by another embodiment of the present invention.

As shown in FIG. 4, step 301 may specifically include:

Step 401: Divide the wideband part of the ultra-wideband audio signal to obtain the low-band part of 0-4 KHz and the high-band part of 4-8 KHz.

Step 402: Encode the low-band part and high-band part of the ultra-wideband audio signal obtained in step 401 to generate an encoded signal of a first core sub-layer and an encoded signal of a second core sub-layer, respectively, where the encoded signal of the first core sub-layer is generated after encoding the low-band part of the ultra-wideband audio signal and the encoded signal of the second core sub-layer is generated after encoding the high-band part of the ultra-wideband audio signal.

The encoder encodes the low-band part and high-band part of the ultra-wideband audio signal in the same way. The following describes the case that the encoder encodes the high-band part of the ultra-wideband audio signal.

In this embodiment, the high-band part of the ultra-wideband audio signal $X_H=\{x_{H1}, x_{H2}, \ldots, x_{HM}\}$, where M indicates the number of samples of the high-band part of the ultra-wideband audio signal; step 402 may use the ADPCM encoding method to encode each sample $x_{H1}$ ($i\in[1, M]$) of the high-band part $X_H$ of the ultra-wideband audio signal and include:

1. Obtain a predicated value $s_{Hi}$ of the current sample $x_{Hi}$ to be encoded.

In this embodiment, if i=1, $s_{Hi}=0$; otherwise, $s_{Hi}=\hat{x}_{H(i-1)}$, where $\hat{x}_{H(i-1)}$ is the local decoded signal of $x_{H(i-1)}$.

2. Obtain a predicated difference $e_{Hi}$ of the current sample $x_{Hi}$ to be encoded by using the following formula (1):

$$x_{Hi}-s_{Hi}=e_{Hi} \qquad (1)$$

3. Quantize $e_{Hi}$ according to the quantized table corresponding to the coded bit number of the sample to obtain the index of the quantized difference $\hat{e}_{Hi}$ in the quantized table, and encode the index to generate an encoded signal $x'_{Hi}$.

In this embodiment, each sample uses 2 bits for encoding, that is, the coded bit number of each sample is 2, and the quantized table corresponding to 2 bits includes 4 quantized values, represented by $-a_1$, $-a_2$, $a_2$, and $a_1$ respectively; the mapping relation between the quantized value corresponding to 2 bits and the index may be shown in Table 1.

TABLE 1

| Index | Quantized value |
|---|---|
| 0 | $-a_1$ |
| 1 | $-a_2$ |
| 2 | $a_2$ |
| 3 | $a_1$ |

The encoder may quantize $e_{Hi}$ through the quantized value and encode the index of the quantized difference $\hat{e}_{Hi}$ in the quantized table to generate an encoded signal $x'_{Hi}$. For example, if $\hat{e}_{Hi}=a_1$ after $e_{Hi}$ is quantized by the quantized table, the encoder uses 2 bits to encode the index 3 corresponding to $a_1$ as shown in Table 1 to generate an encoded signal $x'_{Hi}=11$.

Certainly, in practice, the coded bit number of each sample may be not limited to 2 bits; when any other coded bit number is used to encode each sample, the specific implementation is the same as above, and therefore is not described here.

4. Write the encoded signal of each sample $x_{Hi}$ of the high-band part $X_H$ of the ultra-wideband audio signal into a bitstream to generate an encoded signal of the second core sub-layer.

It should be noted that in practice, step 402 may also encode the low-band part and high-band part of the ultra-wideband audio signal by using other encoding methods; for example, step 402 may encode the low-band part and high-band part of the ultra-wideband audio signal by using the ADPCM method with noise shaping or other methods similar to PCM. In step 402, the encoder may also use different encoding methods to encode the low-band part and high-band part of the ultra-wideband audio signal; for example, the encoder may use the PCM encoding method to encode the low-band part of the ultra-wideband signal and use the ADPCM encoding method to encode the high-band part of the ultra-wideband signal.

Step 403: Write the encoded signals of the first and second core sub-layers generated in step 402 into a bitstream to generate an encoded signal of the core layer.

Step 302: Use the enhancement layer encoding module shown in FIG. 2 to compare residuals of all or a part of the samples of the input signal with encoding thresholds, where the residuals are generated by core layer encoding, and perform encoding according to comparison results to generate an encoded signal of the enhancement layer.

In this embodiment, step 302 specifically encodes the residuals of the high-band part of the ultra-wideband audio signal, where the residuals are generated by core layer encoding. The encoded signal of the enhancement layer is formed by encoded signals of N enhancement sub-layers, where N is a natural number, and may be determined according to the available coded bit number after the encoding of the core layer.

Figure 5:
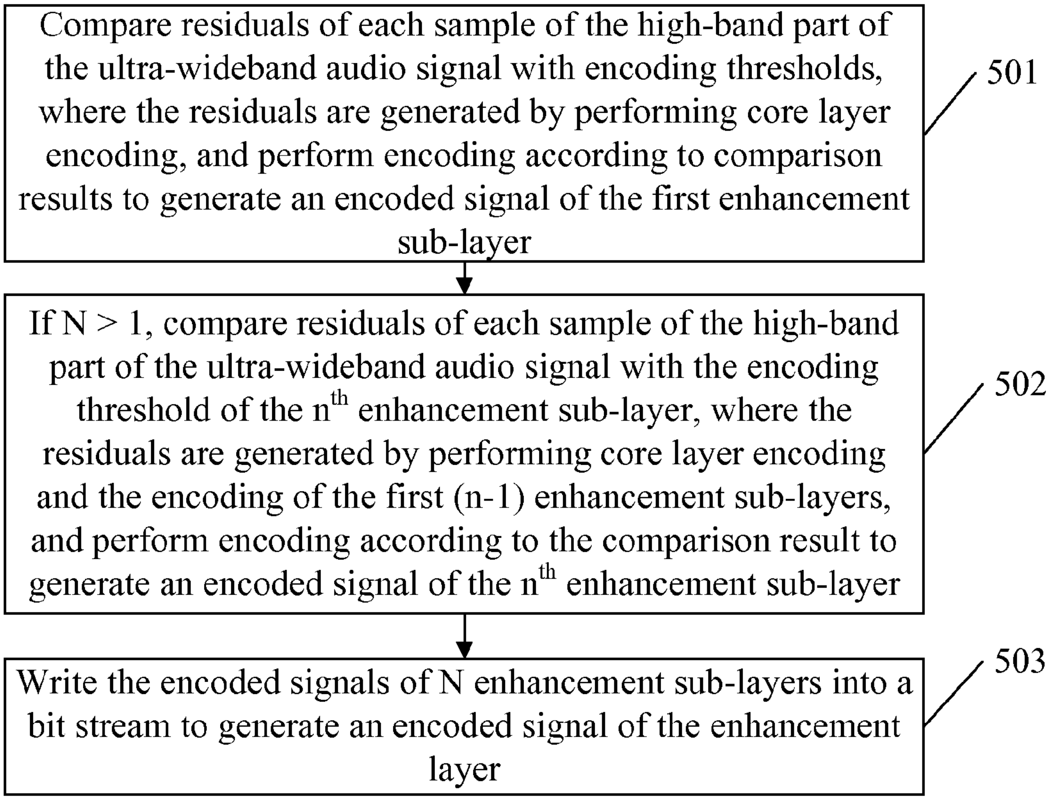
FIG. 5 is a flowchart of step 302 in an encoding method provided by another embodiment of the present invention.
Figure 6:
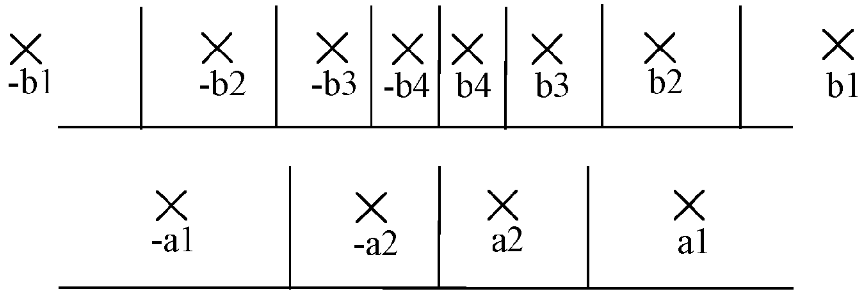
FIG. 6 shows a mapping relation between a quantized value of 3 bits and a quantized value of 2 bits in the encoding method illustrated in FIG. 5.

As shown in FIG. 5, step 302 may specifically include:

Step 501: Compare residuals of each sample of the high-band part of the ultra-wideband audio signal with encoding thresholds, where the residuals are generated by core layer encoding, and perform encoding according to comparison results to generate an encoded signal of the first enhancement sub-layer. This step includes:

1. Set an encoding threshold for the first enhancement sub-layer. In this embodiment, the encoder may use two methods to set an encoding threshold for the first enhancement sub-layer:

The first method is: The encoder sets the encoding threshold for the first enhancement sub-layer by setting the encoding threshold to a constant; in this embodiment, the encoder may set the encoding threshold to 0.

The second method is: The encoder sets the encoding threshold for the first enhancement sub-layer according to the quantized value; specifically, the encoder sets the encoding threshold for the first enhancement sub-layer according to the quantized value corresponding to the total coded bit number of the samples used in the core layer and the first enhancement sub-layer.

In this embodiment, each enhancement sub-layer uses 1 bit to encode the residual $t_{Hi}$ of each sample $x_{Hi}(i\in[1, M])$ of the high-band part $X_H=\{x_{H1}, x_{H2}, \ldots, x_{HM}\}$ of the ultra-wideband audio signal, where the residual is generated by core layer encoding. In step 402, because the encoder uses 2 bits to encode each sample $x_{Hi}$ of the high-band signal $X_H$, the encoder in this step uses the quantized value of the quantized table corresponding to 3 bits to set the encoding threshold for the first enhancement sub-layer. For example, the encoder uses a mid-value or a multiple of the mid-value of every two adjacent quantized values in the quantized table corresponding to 3 bits to set the encoding threshold for the first enhancement sub-layer; specifically, the quantized table corresponding to 3 bits contains 8 quantized values, represented by $-b_1$, $-b_2$, $-b_3$, $-b_4$, $b_4$, $b_3$, $b_2$, and $b_1$ respectively. Assuming the encoding threshold of the first enhancement sub-layer $C_H=\{c_{H1}, c_{H2}, c_{H3}, c_{H4}\}$, $$c_{H1}=\frac{-b_1-b_2}{2}\times\beta,\ c_{H2}=\frac{-b_3-b_4}{2}\times\beta,$$

$$c_{H3}=\frac{b_3+b_4}{2}\times\beta,\ c_{H4}=\frac{b_1+b_2}{2}\times\beta,$$

where β is a multiple and may be any value; the encoder may also set the encoding threshold for the first enhancement sub-layer according to the relation between the quantized table corresponding to 2 bits and the quantized table corresponding to 3 bits; for example, the encoder sets the encoding threshold for the first enhancement sub-layer by using a mid-value of the differences between every two quantized values in the 3-bit quantized table and the corresponding quantized values in the 2-bit quantized table or a multiple of the mid-value thereof, and specifically, $$c_{H1}=\frac{(-b_1+a_1)+(-b_2+a_1)}{2}\times\beta,$$

$$c_{H2}=\frac{(-b_3+a_2)+(-b_4+a_2)}{2}\times\beta,$$

$$c_{H3}=\frac{(b_3-a_2)+(b_4-a_2)}{2}\times\beta,$$

$$c_{H4}=\frac{(b_1-a_1)+(b_2-a_1)}{2}\times\beta,$$

where β is a multiple and may be any value.

In practice, the encoder may use any one or any combination of the above methods to set the encoding threshold for the first enhancement sub-layer; it should be noted that, to meet requirements of different encoding devices, this step may scale up or down the obtained encoding threshold $C_H=\{c_{H1}, c_{H2}, c_{H3}, c_{H4}\}$.

2. Establish a mapping relation between the encoding threshold of the first enhancement sub-layer and the quantized value used in the core layer encoding.

When the encoding threshold of the first enhancement sub-layer is set according to the above quantized value, the mapping relation between the encoding threshold of the first enhancement sub-layer $C_H=\{c_{H1}, c_{H2}, c_{H3}, c_{H4}\}$ and the quantized value used in the core layer encoding may be shown in Table 2.

TABLE 2

| Index | Quantized value | Encoding Threshold |
|---|---|---|
| 0 | $-a_1$ | $c_{H1}$ |
| 1 | $-a_2$ | $c_{H2}$ |
| 2 | $a_2$ | $c_{H3}$ |
| 3 | $a_1$ | $c_{H4}$ |

When the encoding threshold of the first enhancement sub-layer is set to the constant 0, the mapping relation between the encoding threshold 0 and the quantized value used in the core layer encoding may also be shown in Table 2; in this case, all encoding thresholds in Table 2 are 0.

In practice, if the encoding threshold of the first enhancement sub-layer is 0, the mapping relation between the encoding threshold and the quantized value may not be established.

3. Obtain the encoding threshold of the first enhancement sub-layer corresponding to each sample of the high-band part of the ultra-wideband audio signal.

In this embodiment, the encoder may obtain the encoding threshold $C_{Hi}$ of the first enhancement sub-layer corresponding to each sample $x_{Hi}$ of the high-band part $X_H$ of the ultra-wideband audio signal from the pre-stored encoding thresholds or from the above step of setting the encoding threshold for the first enhancement sub-layer.

If the encoding threshold of the first enhancement sub-layer is 0, the encoder may directly obtain the encoding threshold $C_{Hi}=0$ of the first enhancement sub-layer corresponding to each sample $x_{Hi}$ of the high-band part $X_H$ of the ultra-wideband audio signal.

If the encoding threshold of the first enhancement sub-layer is set according to the above quantized value, perform local decoding on the encoded signal $x'_{Hi}$ generated from $x_{Hi}$ by core layer encoding to obtain the index of the quantized table corresponding to 2 bits. According to the index and the mapping relation between the encoding threshold of the first enhancement sub-layer and the quantized value used in the core layer encoding, obtain the encoding threshold $C_{Hi}$ corresponding to $x_{Hi}$; for example, if $x'_{Hi}=11$, the index of the quantized table corresponding to 2 bits obtained after decoding $x'_{Hi}$ is 3, and the encoding threshold $C_{Hi}$ corresponding to $x_{Hi}$ is $c_{H4}$ according to Table 2.

4. Compare the residual of each sample of the high-band part of the ultra-wideband audio signal with the encoding threshold of the first enhancement sub-layer, where the residual is generated by core layer encoding.

In this embodiment, the residual $t_{Hi}$ of each sample $x_{Hi}$ of the high-band part $X_H$ of the ultra-wideband audio signal may be obtained by using the following formula (2) or (3), where the residual is generated by core layer encoding:

$$t_{Hi}=X_{Hi}-\hat{x}_{Hi} \tag{2}$$

$x_{Hi}$ is a sample to be encoded, and $\hat{x}_{Li}$ is a local decoding value of $x_{Hi}$.

$$t_{Hi}=e_{Hi}-\hat{e}_{Hi} \tag{3}$$

$e_{Hi}$ is a predicated difference of $x_{Hi}$, and $\hat{e}_{Hi}$ is a local decoded signal of $e_{Hi}$.

In practice, the residual $t_{Hi}$ of each sample $x_{Hi}$ of the high-band part $X_H$ of the ultra-wideband audio signal by the core layer encoding may be obtained through other methods, and is not described here.

To reduce noise interference on the residual $t_{Hi}$, this step may further include the following step: Perform noise shaping processing on the residual $t_{Hi}$ to generate the residual $t'_{Hi}$ after noise shaping; in this case, the encoder may compare $t'_{Hi}$ with $C_{Hi}$.

In this embodiment, to ensure the reliability of the comparison result of $t_{Hi}$ (or $t'_{Hi}$) and $C_{Hi}$, $t_{Hi}$ (or $t'_{Hi}$) or $C_{Hi}$ needs to be scaled up or down, and the value after scaling is used for comparison. Specifically, multiply $C_{Hi}$ by step information depth in the core layer encoding information and compare the result with $t_{Hi}$ (or $t'_{Hi}$), or, divide $t_{Hi}$ (or $t'_{Hi}$) by depth and compare the result with $C_{Hi}$. Certainly, in practice, $t_{Hi}$ (or $t'_{Hi}$) or $C_{Hi}$ may also be scaled up or down through other methods, which are not described here.

5. According to the comparison result, generate encoded values for the residual $t_{Hi}$ (or $t'_{Hi}$) of each sample $x_{Hi}$ of the high-band part $X_H$ of the ultra-wideband audio signal by the core layer encoding, and write the encoded value of each sample of the high-band part of the ultra-wideband audio signal into a bitstream sequentially to generate an encoded signal of the first enhancement sub-layer.

In this embodiment, if $t_{Hi}$ (or $t'_{Hi}$)>$C_{Hi}$, the encoded value of the residual $t_{Hi}$ (or $t'_{Hi}$) generated from $x_{Hi}$ by core layer encoding is 1; if $t_{Hi}$ (or $t'_{Hi}$)<$C_{Hi}$, or $t_{Hi}$ (or $t'_{Hi}$)=$C_{Hi}$, the encoded value is 0.

Step 502: If N>1, compare residuals of each sample of the high-band part of the ultra-wideband audio signal with the encoding threshold of the $n^{th}$ enhancement sub-layer, where the residuals are generated by core layer encoding and the encoding of the first (n−1) enhancement sub-layers, and perform encoding according to the comparison result to generate an encoded signal of the $n^{th}$ enhancement sub-layer, where $1<n\leqq N$. For the specific implementation, see step 501.

Step 503: Write the encoded signals of N enhancement sub-layers generated in steps 501 and 502 into a bitstream to generate an encoded signal of the enhancement layer.

It should be noted that, in practice, step 302 may encode not only the residual of the high-band part of the ultra-wideband audio signal but also the residual of the low-band part of the ultra-wideband audio signal, where the residuals are generated by core layer encoding, or encode the residuals of the low-band part and high-band part of the ultra-wideband audio signal generated after the core layer encoding, where the residuals are generated by core layer encoding.

Step 303: Use the extended layer encoding module shown in FIG. 2 to encode the ultra-wideband part of the ultra-wideband audio signal to generate an encoded signal of an extended layer.

In this embodiment, the ultra-wideband part of the ultra-wideband audio signal is the 8-14 KHz part of the ultra-wideband audio signal, and the encoder may divide the ultra-wideband audio signal to obtain the 8-14 KHz part of the ultra-wideband audio signal.

The specific implementation of step 303 is basically the same as that of step 301 and is not described here.

Step 304: Write the core layer encoded signal generated in step 301, the enhancement layer encoded signal generated in step 302, and the extended layer encoded signal generated in step 303 into a bitstream to generate an encoded signal of the ultra-wideband audio signal.

With the encoding method provided by the embodiment of the present invention, the encoder encodes the wideband part of the ultra-wideband audio signal to generate an encoded signal of the core layer, compares residuals of the wideband part of the ultra-wideband audio signal by the core layer encoding with encoding thresholds, and performs encoding according to comparison results to generate an encoded signal of the enhancement layer, thus improving encoding quality. Because the encoded signal of the enhancement layer is generated by comparing residuals of the wideband part of the ultra-wideband audio signal by the core layer encoding with encoding thresholds, if the decoder supports only the decoding of encoded signals of a low bit rate, or if the decoder receives only the encoded signals of the low bit rate due to insufficient network bandwidth and poor transmission quality, the quality of the decoded signals generated by the decoder according to the encoded signals of the core layer may be the same as the quality of the encoded signals that are generated by low bit rate encoding, and therefore the decoding quality is improved.

Figure 7:
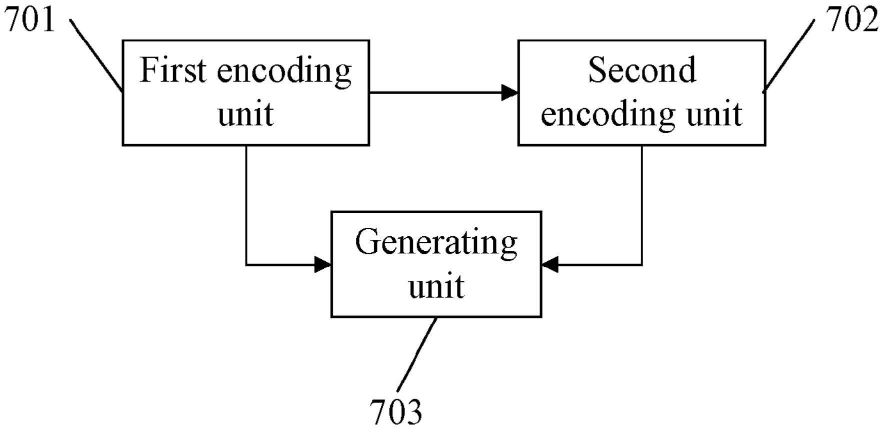
FIG. 7 shows a structure of an encoding device provided by an embodiment of the present invention.

As shown in FIG. 7, an embodiment of the present invention further provides an encoding device, including: a first encoding unit 701, configured to encode each sample of an input signal to generate an encoded signal of a core layer; a second encoding unit 702, configured to compare residuals of all or a part of the samples of the input signal by the core layer encoding with encoding thresholds, and perform encoding according to comparison results to generate an encoded signal of an enhancement layer; and a generating unit 703, configured to write the encoded signal of the core layer generated by the first encoding unit 701 and the encoded signal of the enhancement layer generated by the second encoding unit 702 into a bitstream to generate an encoded signal of the input signal.

Figure 8:
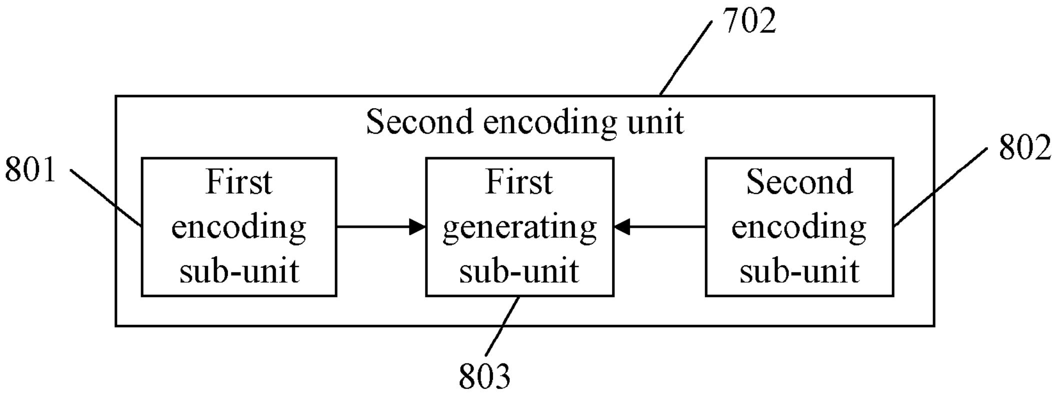
FIG. 8 shows a structure of a second encoding unit 702 in the encoding device illustrated in FIG. 7.

Further, the encoded signal of the enhancement layer is formed by encoded signals of N enhancement sub-layers, where N is a natural number. As shown in FIG. 8, the second encoding unit 702 may include: a first encoding sub-unit 801, configured to compare residuals of all or a part of the samples of the input signal by the core layer encoding with encoding thresholds of the first enhancement sub-layer, and perform encoding according to comparison results to generate an encoded signal of the first enhancement sub-layer; a second encoding sub-unit 802, configured to compare the residuals of all or a part of the samples of the input signal with encoding thresholds of the $n^{th}$ enhancement sub-layer, where the residuals are generated by core layer encoding and encoding of the first (n−1) enhancement sub-layers, and perform encoding according to comparison results to generate an encoded signal of the $n^{th}$ enhancement sub-layer if N>1, where $1<n\leqq N$; and a first generating sub-unit 803, configured to write the encoded signals of the N enhancement sub-layers generated by the first encoding sub-unit 801 and the second encoding sub-unit 802 into the bitstream to generate the encoded signal of the enhancement layer.

Figure 9:
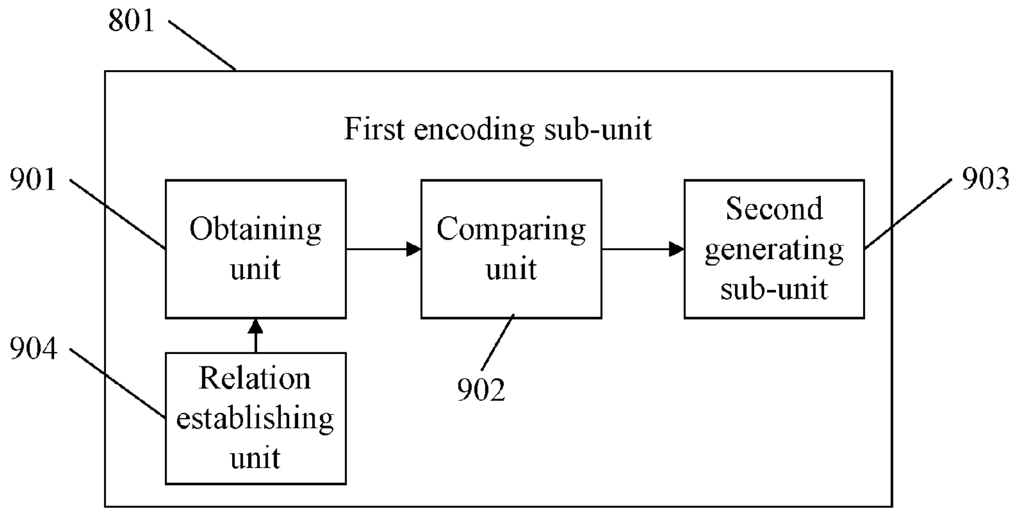
FIG. 9 shows a structure of a first encoding sub-unit 801 in the second encoding unit 702 illustrated in FIG. 8.

Further, as shown in FIG. 9, the first encoding sub-unit 801 may include: an obtaining unit 901, configured to obtain the encoding threshold of the first enhancement sub-layer corresponding to each sample in all or a part of the samples of the input signal; a comparing unit 902, configured to compare the residual of each sample in all or a part of the samples of the input signal by the core layer encoding with the obtained encoding threshold of the first enhancement sub-layer corresponding to the sample; and a second generating sub-unit 903, configured to generate an encoded value for the residual of each sample in all or a part of the samples of the input signal by the core layer encoding according to the comparison result of the comparing unit 902, and write the encoded value of each sample in all or a part of the samples into the bitstream sequentially to generate the encoded signal of the first enhancement sub-layer.

Further, as shown in FIG. 9, the first encoding sub-unit 801 may include: a relation establishing unit 904, configured to establish a mapping relation between the encoding threshold of the first enhancement sub-layer and the quantized value used in the core layer encoding.

In this case, the obtaining unit 901 is further configured to obtain the encoding threshold of the first enhancement sub-layer corresponding to each sample in all or a part of the samples of the input signal according to the mapping relation between the encoding threshold of the first enhancement sub-layer and the quantized value used in the core layer encoding established by the relation establishing unit 904.

For the specific implementation of the encoding device provided by the embodiment of the present invention, see the encoding method provided by embodiments of the present invention.

With the encoding device provided by the embodiment of the present invention, the encoder encodes the input signal to generate an encoded signal of the core layer, compares residuals of all or a part of the samples of the input signal by the core layer encoding with encoding thresholds, and performs encoding according to comparison results to generate an encoded signal of the enhancement layer, thus improving encoding quality; because the encoded signal of the enhancement layer is generated by comparing residuals of all or a part of the samples of the input signal by the core layer encoding with encoding thresholds, if the decoder supports only the decoding of encoded signals of a low bit rate, or if the decoder receives only the encoded signals of the low bit rate due to insufficient network bandwidth and poor transmission quality, the quality of the decoded signals generated by the decoder according to the encoded signals of the core layer may be the same as the quality of the encoded signals that are generated by low bit rate encoding, and therefore the decoding quality is improved.

Figure 10:
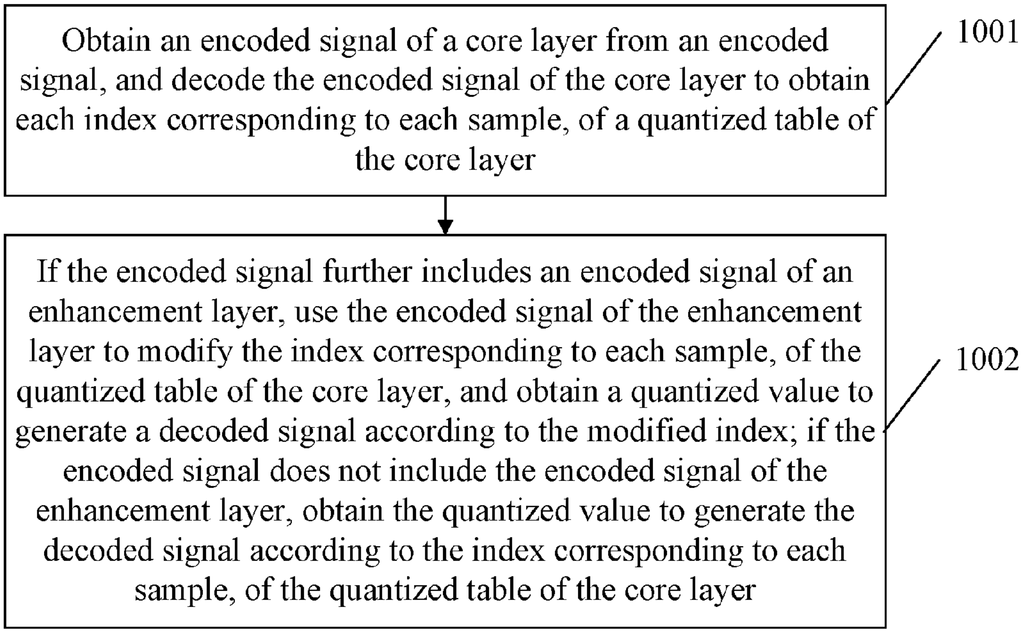
FIG. 10 is a flowchart of a decoding method provided by an embodiment of the present invention.

As shown in FIG. 10, an embodiment of the present invention further provides an decoding method, including:

Step 1001: Obtain an encoded signal of a core layer from an encoded signal, and decode the encoded signal of the core layer to obtain each index corresponding to each sample, of a quantized table of the core layer.

In this embodiment, the encoded signal of the core layer $X'=\{x'_1, x'_2, \ldots, x'_M\}$, where M is the number of encoded samples in the encoded signal X', and step 1001 is: Decode each sample $x'_i$ ($i\in[1, M]$) sequentially to obtain the index of the quantized table of the core layer, and the index is corresponding to each encoded sample $x'_i$.

Step 1002: If the encoded signal further includes an encoded signal of an enhancement layer, use the encoded signal of the enhancement layer to modify the index corresponding to each sample of the quantized table of the core layer, and obtain a quantized value to generate a decoded signal according to the modified index. If the encoded signal does not include the encoded signal of the enhancement layer, obtain the quantized value to generate the decoded signal according to the index corresponding to each sample of the quantized table of the core layer.

In this embodiment, the process of modifying the index corresponding to each sample of the quantized table of the core layer and obtaining the quantized value to generate a decoded signal according to the modified index, including: Left shift the encoded signal of the core layer by n bits, and fill the encoded signal of the enhancement layer into the n bits to generate a modified encoded signal, wherein n is a coded bit number of the encoded sample in the enhancement layer; and decode the modified encoded signal to obtain the modified index, and obtain the quantized value to generate the decoded signal according to the modified index.

Figure 11:
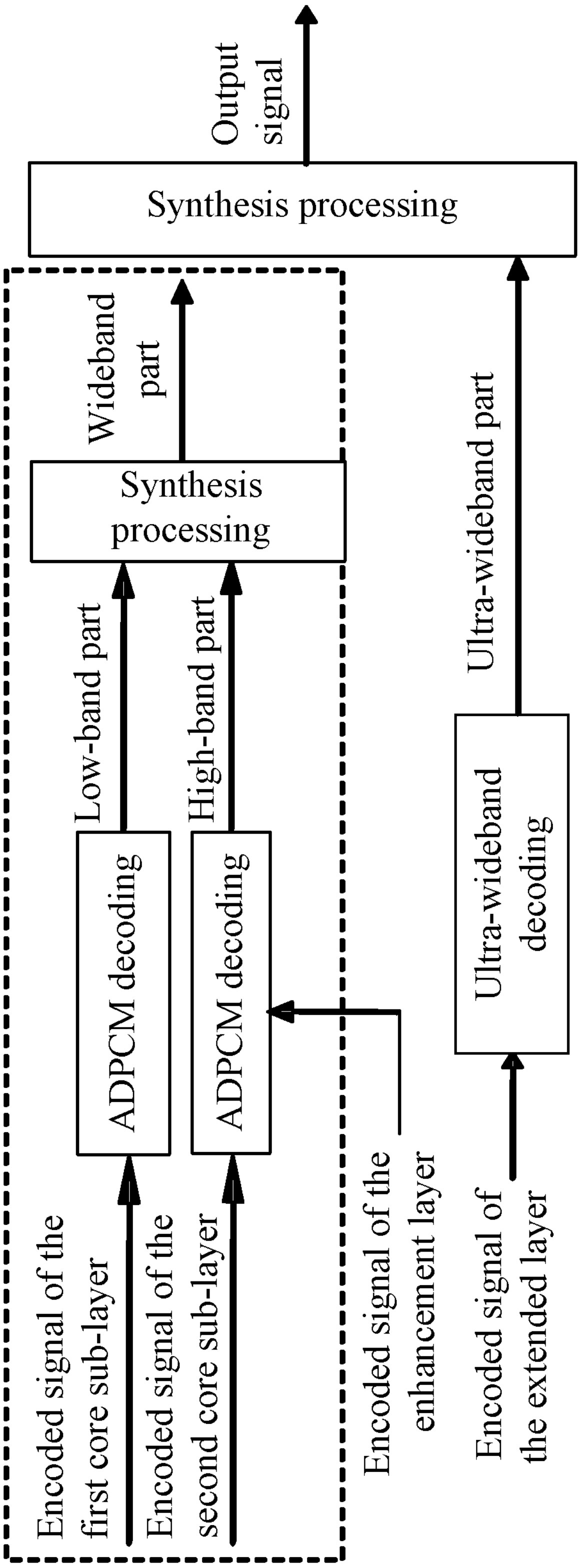
FIG. 11 shows a structure for implementing a decoding method provided by another embodiment of the present invention.

It should be noted that the encoder may perform decoding to obtain the narrowband or wideband input signal by performing steps 1001 and 1002 illustrated in FIG. 10; if the input signal is an ultra-wideband or full-band signal, the encoded signal further carries an encoded signal of the extended layer, and the decoding method provided in the embodiment of the present invention may further decode the encoded signal of the extended layer to generate an ultra-wideband or full-band input signal, which may be implemented by the module illustrated in FIG. 11.

With the decoding method provided by the embodiment of the present invention, if the decoder supports only the decoding of encoded signals of a low bit rate, or if the decoder receives only the encoded signals of the low bit rate due to insufficient network bandwidth and poor transmission quality, the quality of the decoded signals generated by the decoder according to the encoded signals of the core layer may be the same as the quality of the encoded signals that are generated by low bit rate encoding, and therefore the decoding quality is improved. If the encoded signal received by the decoder further includes the encoded signal of the enhancement layer, the encoded signal of the enhancement layer may be used to modify the encoded signal of the core layer to obtain an input signal of good quality, which further improves the quality of the decoded signal.

Figure 12:
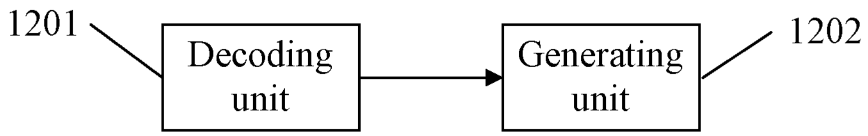
FIG. 12 shows a structure of a decoding device provided by an embodiment of the present invention.

As shown in FIG. 12, an embodiment of the present invention further provides a decoding device, including: a decoding unit 1201, configured to obtain an encoded signal of a core layer from an encoded signal, and decode the encoded signal of the core layer to obtain each index corresponding to each sample of the quantized table of the core layer; and a generating unit 1202, configured to: if the encoded signal further includes an encoded signal of an enhancement layer, use the encoded signal of the enhancement layer to modify the index corresponding to each sample, of the quantized table of the core layer, and obtain a quantized value to generate a decoded signal according to the modified index; if the encoded signal further does not include the encoded signal of the enhancement layer, obtain the quantized value to generate the decoded signal according to the index corresponding to each sample, of the quantized table of the core layer.

Figure 13:
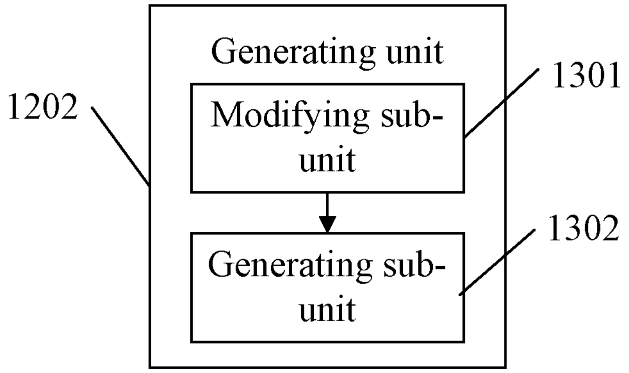
FIG. 13 shows a structure of a generating unit 1202 in the decoding device illustrated in FIG. 12.

Further, as shown in FIG. 13, the generating unit 1202 may include: a modifying sub-unit 1301, configured to left shift the encoded signal of the core layer by n bits, and fill the encoded signal of the enhancement layer into the n bits to generate a modified encoded signal, where n is a coded bit number of the encoded sample in the enhancement layer; a generating sub-unit 1302, configured to decode the modified encoded signal obtained by the modifying sub-unit to obtain the modified index, and obtain the quantized value to generate the decoded signal according to the modified index.

For the implementation of the decoding device, see the decoding method provided by embodiments of the present invention.

With the decoding device provided by the embodiment of the present invention, if the decoding device supports only the decoding of encoded signals of a low bit rate, or if the decoding device receives only the encoded signals of the low bit rate due to insufficient network bandwidth and poor transmission quality, the quality of the decoded signals generated by the decoding device according to the encoded signals of the core layer may be the same as the quality of the encoded signals that are generated by low bit rate encoding, and therefore the decoding quality is improved. If the encoded signal received by the decoding device further includes the encoded signal of the enhancement layer, the encoded signal of the enhancement layer may be used to modify the encoded signal of the core layer to obtain an input signal of good quality, which further improves the quality of the decoded signal.

It is understandable to those skilled in the art that all or a part of the steps of the embodiments can be implemented by hardware following instructions of a program. The program may be stored in a computer readable storage medium. When the program is executed, the processes of the above embodiments may be all included. The storage medium may be a read only memory (ROM), a random access memory (RAM), a magnetic disk or a compact disk-read only memory (CD-ROM).

The above descriptions are merely exemplary embodiments of the present invention, but not intended to limit the scope of the present invention. Various variations or replacements made by persons skilled in the art without departing from the technical scope of the present invention shall fall within the scope of the present invention as defined by the appended claims. Therefore, the scope of the present invention is subject to the appended claims.

What is claimed is:

1. A decoding method, comprising:

obtaining a core layer encoded signal from an encoded signal using a decoding unit;

decoding the core layer encoded signal using a processor to obtain each of a plurality of indexes corresponding to each of a plurality of samples, wherein each index is a core layer quantized table index;

if the encoded signal further comprises an enhancement layer encoded signal, using the enhancement layer encoded signal to modify each index, and obtaining a quantized value to generate a decoded signal according to each modified index; and if the encoded signal does not comprise the enhancement layer encoded signal, obtaining the quantized value to generate the decoded signal according to each index.

2. The method according to claim 1, wherein using the enhancement layer encoded signal to modify each index, and obtaining a quantized value to generate a decoded signal according to each modified index comprises:

left shifting the core layer encoded signal by n bits, and filling the enhancement layer encoded signal into the n bits to generate a modified encoded signal, wherein n is a coded bit number of samples in the enhancement layer; and decoding the modified encoded signal to obtain a modified index, and obtaining the quantized value to generate the decoded signal according to the modified index.

3. A decoding device, comprising:

a decoding unit, configured to obtain a core layer encoded signal from an encoded signal, and decode the core layer encoded signal to obtain each of a plurality of indexes corresponding to each of a plurality of samples, wherein each index is a core layer quantized table index; and a generating unit, wherein if the encoded signal further comprises an enhancement layer encoded signal, the generating unit is configured to use the enhancement layer encoded signal to modify each index, and obtain a quantized value to generate a decoded signal according to each modified index; and if the encoded signal does not comprise the enhancement layer encoded signal, the generating unit is configured to obtain the quantized value to generate the decoded signal according to each index.

4. The device according to claim 3, wherein the generating unit comprises:

a modifying sub-unit, configured to left shift the core layer encoded signal by n bits, and fill the enhancement layer encoded signal into the n bits to generate a modified encoded signal, wherein n is a coded bit number of samples in the enhancement layer; and a generating sub-unit, configured to decode the modified encoded signal obtained by the modifying sub-unit to obtain a modified index, and obtain the quantized value to generate the decoded signal according to the modified index.

5. A non-transitory computer-readable storage medium, comprising computer program codes which when executed by a computer processor cause the computer processor to execute steps of:

obtaining a core layer encoded signal from an encoded signal, and decoding the core layer encoded signal to obtain each of a plurality of indexes corresponding to each of a plurality of samples, wherein each index is a core layer quantized table index;

if the encoded signal further comprises an enhancement layer encoded signal, using the enhancement layer encoded signal to modify each index, and obtaining a quantized value to generate a decoded signal according to each modified index; and if the encoded signal does not comprise the enhancement layer encoded signal, obtaining the quantized value to generate the decoded signal according to each index.

6. The non-transitory computer-readable storage medium according to claim 5, wherein using the enhancement layer encoded signal to modify each index, and obtaining a quantized value to generate a decoded signal according to each modified index comprises:

left shifting the encoded signal of the core layer by n bits, and filling the enhancement layer encoded signal into the n bits to generate a modified encoded signal, wherein n is a coded bit number of samples in the enhancement layer; and decoding the modified encoded signal to obtain a modified index, and obtaining the quantized value to generate the decoded signal according to the modified index.

* * * * *